United States Patent
Retz et al.

(10) Patent No.: US 8,952,710 B2
(45) Date of Patent: Feb. 10, 2015

(54) PULSED BEHAVIOR MODELING WITH STEADY STATE AVERAGE CONDITIONS

(75) Inventors: James M. Retz, Cedar Rapids, IA (US); Andrew F. Folkmann, Cedar Rapids, IA (US); Jean-Frederic Chiron, Tournefeuille (FR)

(73) Assignee: RF Micro Devices, Inc., Greensboro, NC (US)

( * ) Notice: Subject to any disclaimer, the term of this patent is extended or adjusted under 35 U.S.C. 154(b) by 295 days.

(21) Appl. No.: 13/548,283

(22) Filed: Jul. 13, 2012

(65) Prior Publication Data

US 2013/0181730 A1    Jul. 18, 2013

Related U.S. Application Data

(60) Provisional application No. 61/508,187, filed on Jul. 15, 2011.

(51) Int. Cl.
*G01R 31/28* (2006.01)

(52) U.S. Cl.
CPC ............ *G01R 31/28* (2013.01); *G01R 31/2834* (2013.01); *G01R 31/2839* (2013.01)
USPC .................................................. 324/750.01

(58) Field of Classification Search
CPC ... G01R 31/2834; G01R 31/2839; G01J 5/14; G05B 13/048; G05B 17/02; G05B 19/00
See application file for complete search history.

(56) References Cited

U.S. PATENT DOCUMENTS

| | | | |
|---|---|---|---|
| 3,969,682 A | 7/1976 | Rossum | |
| 3,980,964 A | 9/1976 | Grodinsky | |
| 4,587,552 A | 5/1986 | Chin | |
| 4,692,889 A | 9/1987 | McNeely | |
| 4,831,258 A * | 5/1989 | Paulk et al. | 250/349 |

(Continued)

FOREIGN PATENT DOCUMENTS

| | | |
|---|---|---|
| EP | 0755121 A2 | 1/1997 |
| EP | 1492227 A1 | 12/2004 |

(Continued)

OTHER PUBLICATIONS

Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.

(Continued)

*Primary Examiner* — Tung X Nguyen
(74) *Attorney, Agent, or Firm* — Withrow & Terranova, P.L.L.C.

(57) ABSTRACT

A method for pulsed behavior modeling of a device under test (DUT) using steady state conditions is disclosed. The method includes providing an automated test system (ATS) programmed to capture at least one behavior of the DUT. The ATS then generates a DUT input power pulse that transitions from a predetermined steady state level to a predetermined pulse level and back to the predetermined steady state level. At least one behavior of the DUT is then captured by the ATS while the input power is at the predetermined pulse level. The ATS then steps the predetermined pulse level to a different predetermined pulse level, and the above steps are repeated until a range of predetermined pulse levels is swept. The ATS then steps the predetermined steady state level to a different steady state level, and the above steps are repeated until a range of predetermined steady state levels is swept.

22 Claims, 10 Drawing Sheets

(56) References Cited

U.S. PATENT DOCUMENTS

| | | |
|---|---|---|
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,486,871 A | 1/1996 | Filliman et al. |
| 5,532,916 A | 7/1996 | Tamagawa |
| 5,541,547 A * | 7/1996 | Lam .............................. 327/355 |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,133,777 A | 10/2000 | Savelli |
| 6,141,541 A | 10/2000 | Midya et al. |
| 6,147,478 A | 11/2000 | Skelton et al. |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,058,373 B2 | 6/2006 | Grigore |
| 7,099,635 B2 | 8/2006 | McCune |
| 7,164,893 B2 | 1/2007 | Leizerovich et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,279,875 B2 | 10/2007 | Gan et al. |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,859,336 B2 | 12/2010 | Markowski et al. |
| 7,880,547 B2 | 2/2011 | Lee et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,274,332 B2 | 9/2012 | Cho et al. |
| 8,289,084 B2 | 10/2012 | Morimoto et al. |
| 8,362,837 B2 | 1/2013 | Koren et al. |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,718,582 B2 | 5/2014 | See et al. |
| 2002/0071497 A1 | 6/2002 | Bengtsson et al. |
| 2003/0017286 A1 | 1/2003 | Williams et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0093630 A1 | 5/2005 | Whittaker et al. |
| 2005/0110562 A1 | 5/2005 | Robinson et al. |
| 2005/0122171 A1 | 6/2005 | Miki et al. |

(56) References Cited

U.S. PATENT DOCUMENTS

| | | |
|---|---|---|
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0063681 A1 | 3/2007 | Liu |
| 2007/0082622 A1 | 4/2007 | Leinonen et al. |
| 2007/0146076 A1 | 6/2007 | Baba |
| 2007/0182392 A1 | 8/2007 | Nishida |
| 2007/0183532 A1 | 8/2007 | Matero |
| 2007/0259628 A1 | 11/2007 | Carmel et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0280577 A1 | 11/2008 | Beukema et al. |
| 2009/0004981 A1 | 1/2009 | Eliezer et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0017553 A1 | 1/2010 | Laurencin et al. |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2011/0018626 A1 | 1/2011 | Kojima |
| 2011/0058601 A1 | 3/2011 | Kim et al. |
| 2011/0084760 A1 | 4/2011 | Guo et al. |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0279180 A1 | 11/2011 | Yamanouchi et al. |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0299647 A1 | 11/2012 | Honjo et al. |
| 2013/0034139 A1 | 2/2013 | Khlat et al. |
| 2013/0094553 A1 | 4/2013 | Paek et al. |
| 2013/0169245 A1 | 7/2013 | Kay et al. |
| 2013/0214858 A1 | 8/2013 | Tournatory et al. |
| 2013/0229235 A1 | 9/2013 | Ohnishi |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |

FOREIGN PATENT DOCUMENTS

| | | |
|---|---|---|
| EP | 1569330 A1 | 8/2005 |
| EP | 2214304 A1 | 8/2010 |
| EP | 2244366 A1 | 10/2010 |
| EP | 2372904 A1 | 10/2011 |
| GB | 2462204 A | 2/2010 |
| GB | 2465552 A | 5/2010 |
| GB | 2484475 A | 4/2012 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012172544 A1 | 12/2012 |

OTHER PUBLICATIONS

Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.

International Preliminary Report on Patentability for PCT/US2012/040317, mailed Dec. 12, 2013, 5 pages.

Notice of Allowance for U.S. Appl. No. 13/531,719, mailed Dec. 30, 2013, 7 pages.

Non-Final Office Action for U.S. Appl. No. 14/022,940, mailed Dec. 20, 2013, 5 pages.

International Search Report and Written Opinion for PCT/US2013/052277, mailed Jan. 7, 2014, 14 pages.

Notice of Allowance for U.S. Appl. No. 12/836,307 mailed May 5, 2014, 6 pages.

Notice of Allowance for U.S. Appl. No. 14/022,858 mailed May 27, 2014, 6 pages.

Non-Final Office Action for U.S. Appl. No. 13/367,973 mailed Apr. 25, 2014, 5 pages.

Non-Final Office Action for U.S. Appl. No. 13/647,815 mailed May 2, 2014, 6 pages.

Non-Final Office Action for U.S. Appl. No. 13/689,883 mailed Mar. 27, 2014, 13 pages.

Non-Final Office Action for U.S. Appl. No. 13/692,084 mailed Apr. 10, 2014, 6 pages.

Non-Final Office Action for U.S. Appl. No. 13/684,826 mailed Apr. 3, 2014, 5 pages.

Notice of Allowance for U.S. Appl. No. 14/022,940, mailed Jun. 10, 2014, 7 pages.

Non-Final Office Action for U.S. Appl. No. 13/714,600 mailed May 9, 2014, 14 pages.

Non-Final Office Action for U.S. Appl. No. 13/951,976 mailed Apr. 4, 2014, 7 pages.

Examination Report for European Patent Application No. 11720630.0 issued Mar. 18, 2014, 4 pages.

International Preliminary Report on Patentability for PCT/US2012/062070 mailed May 8, 2014, 8 pages.

(56) References Cited

OTHER PUBLICATIONS

International Search Report and Written Opinion for PCT/US2012/062110 issued Apr. 8, 2014, 12 pages.
International Preliminary Report on Patentability for PCT/US2012/062110 mailed May 8, 2014, 9 pages.
International Preliminary Report on Patentability for PCT/US2012/024124, mailed Aug. 22, 2013, 8 pages.
International Preliminary Report on Patentability for PCT/US2012/023495, mailed Aug. 15, 2013, 10 pages.
Dixon, N., "Standardization boosts momentum for Envelope tracking," Microwave Engineers, Europe, Apr. 20, 2011, 2 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Kim, N. et al, "Ripple feedback filter suitable for analog/digital mixed-mode audio amplifier for improved efficiency and stability," 33rd Annual Power Electronics Specialists Conference, vol. 1, Jun. 23, 2002, pp. 45-49.
Kim, D. et al., "High Efficiency and Wideband Envelope Tracking Power Amplifier with Sweet Spot Tracking," 2010 IEEE Radio Frequency Integrated Circuits Symposium, May 23-25, 2010, pp. 255-258.
Knutson, P, et al., "An Optimal Approach to Digital Raster Mapper Design," 1991 IEEE Transactions on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm2 at 81% Efficiency," 2010 IEEE International Solid State Circuits Conference, Feb. 7-11, 2010, pp. 210-212.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira files 100th envelope tracking patent," CS: Compound Semiconductor, Apr. 11, 2011, 1 page.
Non-final Office Action for U.S. Appl. No. 12/112,006 mailed Apr. 5, 2010, now Patent No. 7,884,681, 6 pages.
Notice of Allowance for U.S. Appl. No. 12/112,006 mailed Jul. 19, 2010, now Patent No. 7,884,681, 6 pages.
International Search Report for PCT/US11/033037 mailed Aug. 9, 2011, 10 pages.
International Search Report for PCT/US2011/044857 mailed Oct. 24, 2011, 10 pages.
International Search Report for PCT/US11/49243 mailed Dec. 22, 2011, 9 pages.
International Search Report for PCT/US2011/064255 mailed Apr. 3, 2012, 12 pages.
Non-final Office Action for U.S. Appl. No. 11/113,873, now Patent No. 7,773,691 mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
International Search Report for PCT/US2011/061009 mailed Feb. 8, 2012, 14 pages.
International Search Report for PCT/US2012/023495 mailed May 7, 2012, 13 pages.
Invitation to Pay Additional Fees and Where Applicable Protest Fee for PCT/US2011/061007 mailed Feb. 13, 2012, 7 pages.
Hekkala, A. et al., "Adaptive time misalignment compensation in envelope tracking amplifiers," International Symposium on Spread Spectrum Techniques and Applications, Aug. 2008, pp. 761-765.
Invitation to Pay Additional Fees and Where Applicable Protest Fee for PCT/US2012/024124 mailed Jun. 1, 2012, 7 pages.
Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
International Search Report for PCT/US2011/061007 mailed Aug. 16, 2012, 16 pages.
International Search Report for PCT/US2012/024124 mailed Aug. 24, 2012, 14 pages.
Notice of Allowance for U.S. Appl. No. 13/297,490, mailed Feb. 27, 2014, 7 pages.
Non-Final Office Action for U.S. Appl. No. 13/297,470, mailed Feb. 20, 2014, 16 pages.
Notice of Allowance for U.S. Appl. No. 13/550,049, mailed Mar. 6, 2014, 5 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
Non-Final Office Action for U.S. Appl. No. 13/661,552, mailed Feb. 21, 2014, 5 pages.
International Search Report and Written Opinion for PCT/US2013/065403, mailed Feb. 5, 2014, 11 pages.
International Preliminary Report on Patentability for PCT/US2011/044857 mailed Mar. 7, 2013, 6 pages.
Notice of Allowance for U.S. Appl. No. 13/218,400 mailed Apr. 11, 2013, 7 pages.
Non-Final Office Action for U.S. Appl. No. 13/297,470 mailed May 8, 2013, 15 pages.
Notice of Allowance for U.S. Appl. No. 13/222,453 mailed Feb. 21, 2013, 7 pages.
Final Office Action for U.S. Appl. No. 13/222,484 mailed Apr. 10, 2013, 10 pages.
International Search Report and Written Opinion for PCT/US2012/053654 mailed Feb. 15, 2013, 11 pages.
International Search Report and Written Opinion for PCT/US2012/067230 mailed Feb. 21, 2013, 10 pages.
Notice of Allowance for U.S. Appl. No. 13/188,024, mailed Jun. 18, 2013, 8 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
International Preliminary Report on Patentability for PCT/US2011/061009 mailed May 30, 2013, 10 pages.
Non-Final Office Action for U.S. Appl. No. 13/423,649, mailed May 22, 2013, 7 pages.
Advisory Action for U.S. Appl. No. 13/222,484, mailed Jun. 14, 2013, 3 pages.
International Preliminary Report on Patentability for PCT/US2011/064255, mailed Jun. 20, 2013, 7 pages.
Notice of Allowance for U.S. Appl. No. 13/343,840, mailed Jul. 1, 2013, 8 pages.
Non-final Office Action for U.S. Appl. No. 13/218,400 mailed Nov. 8, 2012, 7 pages.
Notice of Allowance for U.S. Appl. No. 13/316,229 mailed Nov. 14, 2012, 9 pages.
Non-final Office Action for U.S. Appl. No. 13/222,484 mailed Nov. 8, 2012, 9 pages.
International Preliminary Report on Patentability for PCT/US11/49243 mailed Nov. 13, 2012, 33 pages.
Non-final Office Action for U.S. Appl. No. 13/089,917 mailed Nov. 23, 2012, 6 pages.
Non final Office Action for U.S. Appl. No. 13/222,453 mailed Dec. 6, 2012, 13 pages.

(56) References Cited

OTHER PUBLICATIONS

International Preliminary Report on Patentability for PCT/US2011/033037 mailed Oct. 23, 2012, 7 pages.
Final Office Action for U.S. Appl. No. 13/297,470, mailed Oct. 25, 2013, 17 pages.
Notice of Allowance for U.S. Appl. No. 14/022,858, mailed Oct. 25, 2013, 9 pages.
Non-Final Office Action for U.S. Appl. No. 13/550,049, mailed Nov. 25, 2013, 6 pages.
Non-Final Office Action for U.S. Appl. No. 12/836,307, mailed Nov. 5, 2013, 6 pages.
Examination Report for European Patent Application No. 11720630, mailed Aug. 16, 2013, 5 pages.
International Search Report for PCT/US2011/054106 mailed Feb. 9, 2012, 11 pages.
International Search Report for PCT/US12/40317 mailed Sep. 7, 2012, 7 pages.
International Search Report for PCT/US2012/046887 mailed Dec. 21, 2012, 12 pages.
Non-Final Office Action for U.S. Appl. No. 13/188,024, mailed Feb. 5, 2013, 8 pages.
International Search Report and Written Opinion for PCT/US2012/062070, mailed Jan. 21, 2013, 12 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Quayle Action for U.S. Appl. No. 13/531,719, mailed Oct. 10, 2013, 5 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
Notice of Allowance for U.S. Patent Application No. 141072,140, mailed Aug. 27, 2014, 8 pages.
Non-Final Office Action for U.S. Patent Application No. 14/072,225, mailed Aug. 15, 2014, 4 pages.
Non-Final Office Action for U.S. Patent Application No. 13/486,012, mailed Jul. 28, 2014, 7 pages.
Non-Final Office Action for U.S. Patent Application No. 13/689,883, mailed Aug. 27, 2014, 12 pages.
Notice of Allowance for U.S. Patent Application No. 131661,552, mailed Jun. 13, 2014, 5 pages.
Notice of Allowance for U.S. Patent Application No. 131692,084, mailed Jul. 23, 2014, 7 pages.
Notice of Allowance for U.S. Patent Application No. 131690,187, mailed Sep. 3, 2014, 9 pages.
Notice of Allowance for U.S. Patent Application No. 131684,826, mailed Jul. 18, 2014, 7 pages.
Non-Final Office Action for U.S. Patent Application No. 13/782,142, mailed Sep. 4, 2014, 6 pages.
Hassan, Muhammad, et al., "A Combined Series-Parallel Hybrid Envelope Amplifier for Envelope Tracking Mobile Terminal Rf Power Amplifier Applications," IEEE Journal of Solid-State Circuits, vol. 47, no. 5, May 1, 2012, pp. 1185-1198.
Hoversten, John, et al, "Codesign of Pa, Supply, and Signal Processing for Linear Supply-Modulated Rf Transmitters," IEEE Transactions on Microwave Theory and Techniques, vol. 60, no. 6, Jun. 2012, pp. 2010-2020.
European Search Report for Patent Application No. 14162682.0, issued Aug. 27, 2014, 7 pages.
International Preliminary Report on Patentability and Written Opinion for PCT/US2012/067230, mailed Jun. 12, 2014, 7 pp.
International Search Report and Written Opinion for PCT/US2014/028089, mailed Jul. 17, 2014, 10 pages.
Invitation to Pay Additional Fees and Partial International Search Report for PCT/US2014I028178, mailed Jul. 24, 2014, 7 pp.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl, No. 13/714,600, mailed Oct. 15, 2014, 13 pages.
Notice of Allowance for U.S. Appl. No. 131914,888, mailed Oct. 17, 2014, 10 pages.
Non-Final Office Action for U.S. Appl. No. 13/747,725, mailed Oct. 7, 2014, 6 pages.
Notice of Allowance for U.S. Appl. No. 13/486,012, mailed Nov. 21, 2014, 8 pages.
Non-Final Office Action for U.S. Appl. No. 13/747,749, mailed Nov. 12, 2014, 32 pages.
Notice of Allowance for U.S. Appl. No. 141072, 140, mailed Dec. 2, 2014, 8 pages.
Extended European Search Report for European Patent Application No. 12794149.0, issued Oct. 29, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.

* cited by examiner

PULSED BEHAVIOR MODELING WITH STEADY STATE AVERAGE CONDITIONS

RELATED APPLICATIONS

This application claims the benefit of provisional patent application Ser. No. 61/508,187, filed Jul. 15, 2011, the disclosure of which is hereby incorporated herein by reference in its entirety.

FIELD OF THE DISCLOSURE

The present disclosure is related to modeling the behavior of a device under test (DUT). In particular, the present disclosure is related to pulse behavior modeling of DUTs such as power amplifiers (PAs).

BACKGROUND

Behavior models are valuable tools for power amplifier (PA) design and system analysis. As shown in FIG. 1, a traditional approach for obtaining a behavior models for PAs relies on pulsed measurements where an input power sweep is performed at a low duty cycle with a device under test (DUT) turned off during a remaining portion of the duty cycle. The exemplary input power sweep shown in FIG. 1 has a 5% duty cycle with an average input power of −100 dBm, wherein an instantaneous input power (PINST) is stepped from −30 dBm to 10 dBm in 1 dB steps. During the DUT off portion of the duty cycle, the DUT is disabled by removing the average input power or by disabling the bias to the DUT. An average input power of −100 dBm as shown in FIG. 1 effectively disables the DUT for 95% of the duty cycle. However, leaving the DUT off for such a relatively long portion of the duty cycle prevents the DUT from reaching steady state conditions associated with operation of the DUT in various applications. Consequently, data collected using the traditional approach will result in relatively inaccurate modeling of DUT performance for relatively complex applications that use one or more DUT models to generate pre-distortion for a PA. Thus, there remains a need for a method and system that accurately models DUT performance for operating conditions encountered in complex systems such as an envelope tracking system that employs pre-distortion to linearize an associated PA.

SUMMARY

The present disclosure provides a method for pulsed behavior modeling of a device under test (DUT) using steady state conditions. The method includes providing an automated test system (ATS) programmed to capture at least one behavior of the DUT. The ATS then generates a DUT input power pulse that transitions from a predetermined steady state level to a predetermined pulse level and back to the predetermined steady state level. At least one behavior of the DUT is then captured by the ATS while the input power is at the predetermined pulse level. The ATS then steps the predetermined pulse level to a different predetermined pulse level, and the above steps are repeated until a range of predetermined pulse levels is swept. The ATS then steps the predetermined steady state level to a different steady state level, and the above steps are repeated until a range of predetermined steady state levels is swept.

In at least one exemplary embodiment, the present disclosure also provides for an extended method that adds pulse modeling of PA behavior under envelope tracking conditions. This extended method further includes a step of setting a predetermined average PA supply voltage in association with generating the input power signal for the DUT. The extended method further includes stepping a predetermined PA supply voltage pulse level to a different predetermined PA supply pulse level via the ATS in connection with stepping the predetermined steady state level to a different steady state level. Moreover, a tangible computer-readable medium having instruction code stored thereon is provided for instructing a computing device of the ATS to perform operations for pulsed behavior modeling of the DUT. Further still, in one exemplary embodiment, the tangible computer readable medium may also be writable for recording data related to pulsed behavior of the DUT captured using the present method.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure provides a test process that applies average steady state type operating conditions to a device under test (DUT) during the time between input power pulses that are swept over a range of predetermined input power pulse levels. Average operation conditions could vary based on the type of DUT. For example, in a standard linear PA, the average condition may be achieved by applying average RF power at a RF input of the DUT with nominal bias applied. In another example, an envelope tracking PA might achieve average steady state conditions by applying both the average RF input power and average supply voltage that is typically a collector voltage (VCC) or drain voltage (VDD).

Figure 1:
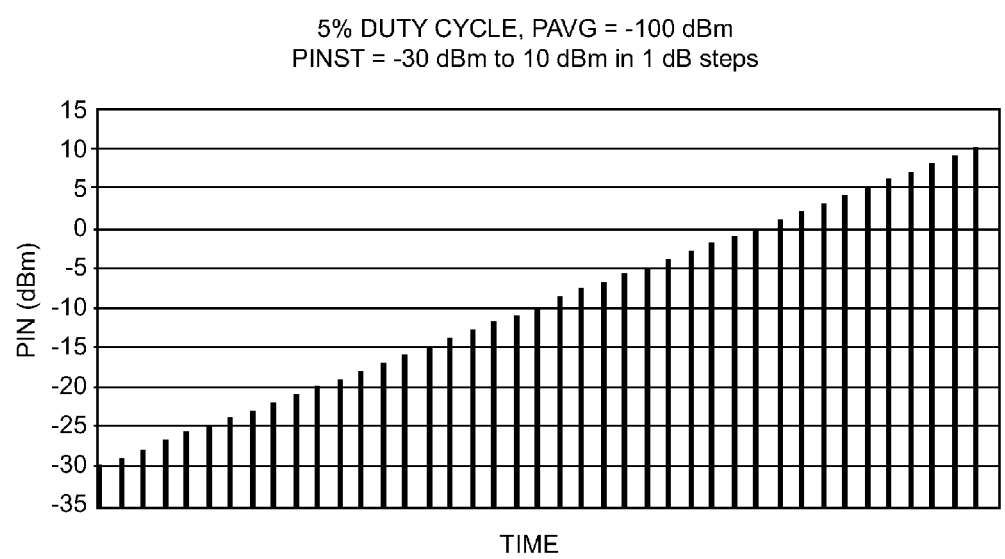
FIG. 1 is a graph of input power versus time of an input power sweep used to obtain a traditional device under test (DUT) behavior model.
Figure 2:
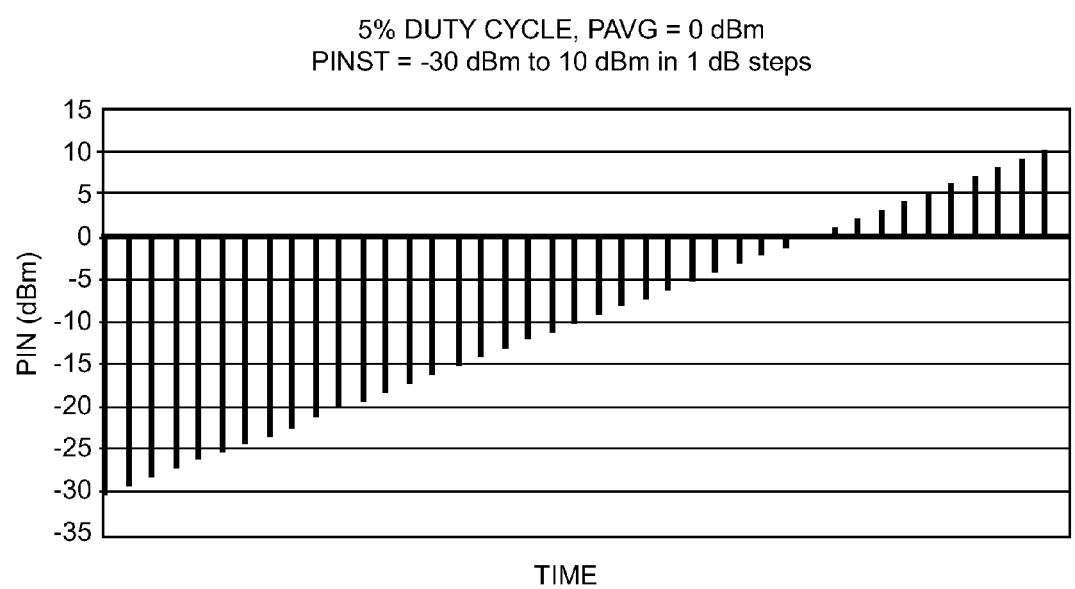
FIG. 2 is a graph of input power versus time of an input power sweep usable to obtain a DUT behavior model according to the present disclosure.

FIG. 2 is a graph of input power versus time of an input power sweep usable to obtain a DUT behavior model according to the present disclosure. In this exemplary case, a pulse measurement is modified to set an average steady state operating condition during the DUT off portions of a duty cycle. This is accomplished by setting an RF input drive level to a desired average power during the off portion of the duty cycle. In an exemplary case depicted in FIG. 2, the RF input drive level is set to 0 dBm average power during the off portion of the duty cycle, which in this case is for 95% of the duty cycle. During the other 5% of the time an instantaneous input power pulse PINST is applied to the input of the DUT. It is to be understood that the term instantaneous is a relative term that is used to describe a relatively sharp transition from a predetermined steady state level to a predetermined pulse level and back to the predetermined steady state level. In this exemplary case shown in FIG. 2, PINST is swept in an incremental fashion over a range that extends from a beginning predetermined pulse level of −30 dBm to an ending predetermined pulse level of 10 dBm using 1 dB steps. However, other beginning and ending predetermined pulse levels as well as other step sizes may be chosen. Moreover, the predetermined levels for PINST can be decremented from a beginning predetermined to an ending predetermined pulse level instead of incremented, or the order of the predetermined levels for PINST can be randomized.

Figure 3A:
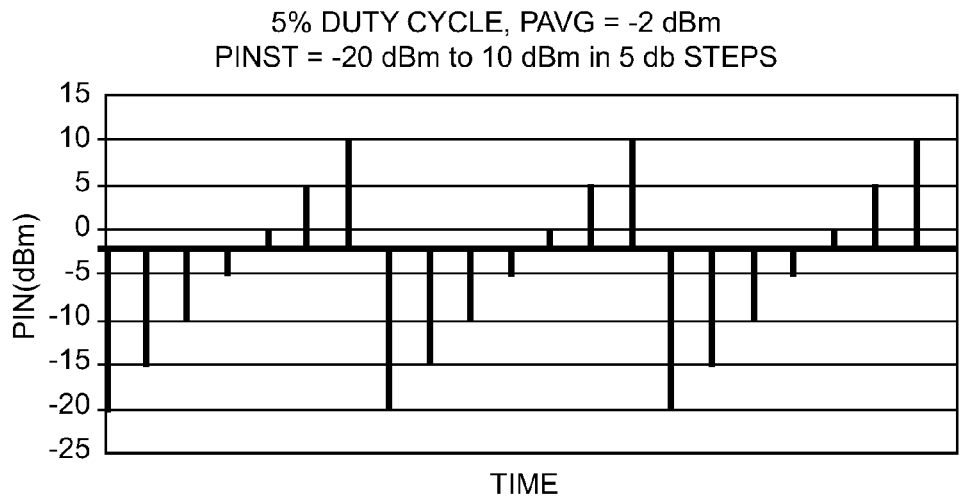
FIGS. 3A and 3B are graphs of exemplary input power and supply voltage sweeps usable to obtain a DUT behavior model under a steady state average condition.
Figure 3B:
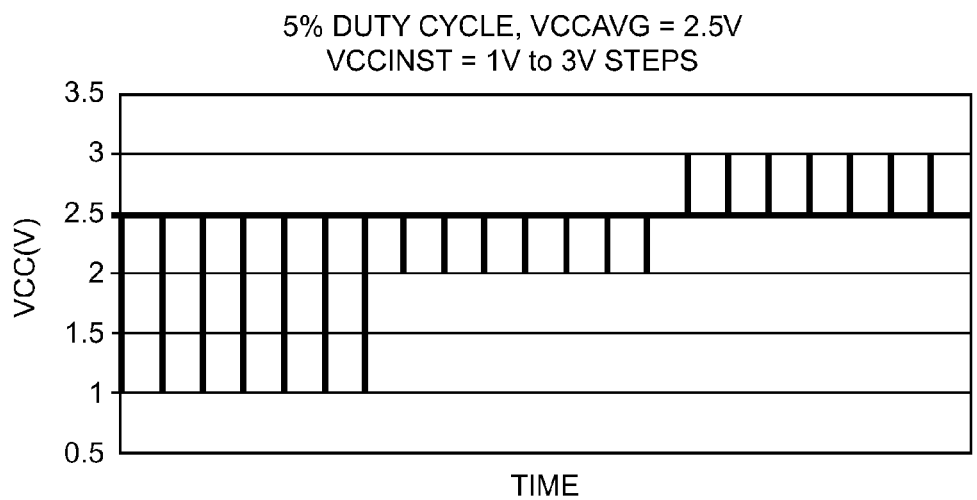

FIGS. 3A and 3B are graphs of exemplary input power and supply voltage sweeps usable to obtain a DUT behavior model under a steady state average condition. These input power and supply voltage sweeps are particularly useful for modeling the behavior of a DUT used in an envelope tracking system. In this scenario, both a RF input drive level Pin (FIG. 3A) and a supply voltage VCC (FIG. 3B) are set to average operating conditions between steps of a measurement sweep. In this exemplary case, the average Pin is −2.5 dBm and the average VCC is 2.5V. The Pin sweep range is −20 dBm to 10 dBm in 5 dB steps and the VCC sweep range is 1V to 3V in 1V steps. In this exemplary case, the Pin sweep of the predetermined pulse levels is nested inside the VCC sweep of predetermined supply voltage pulse levels (VCCINST).

Figure 4:
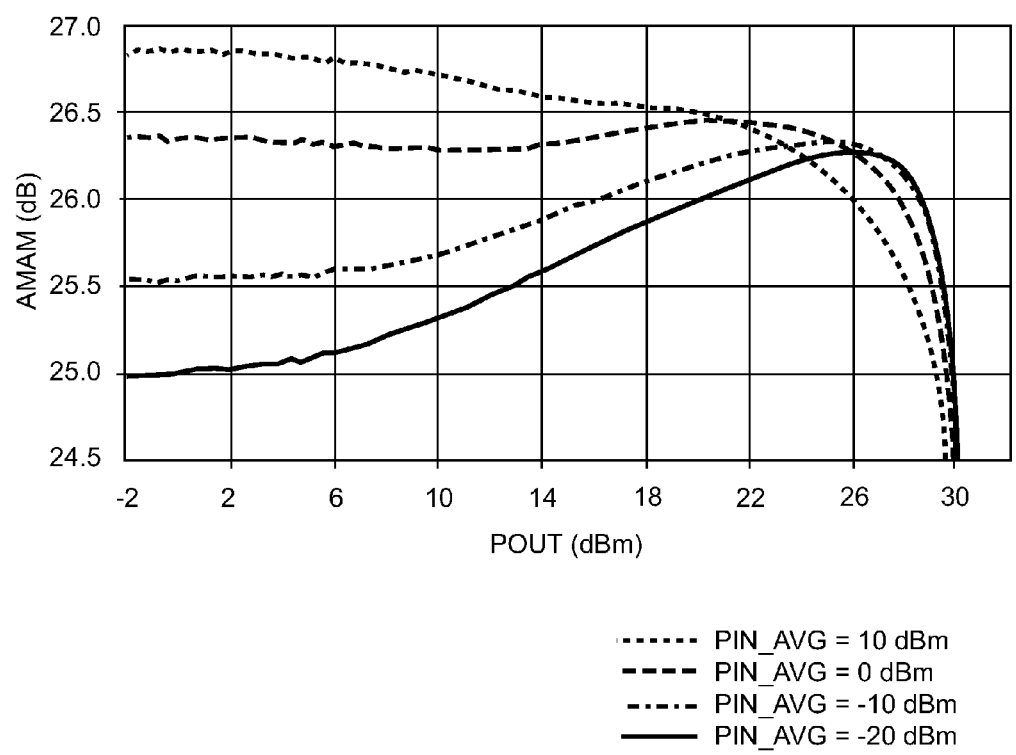
FIG. 4 is a graph of exemplary amplitude modulation—amplitude modulation (AMAM) data corresponding to a family of steady state average power input curves.
Figure 5:
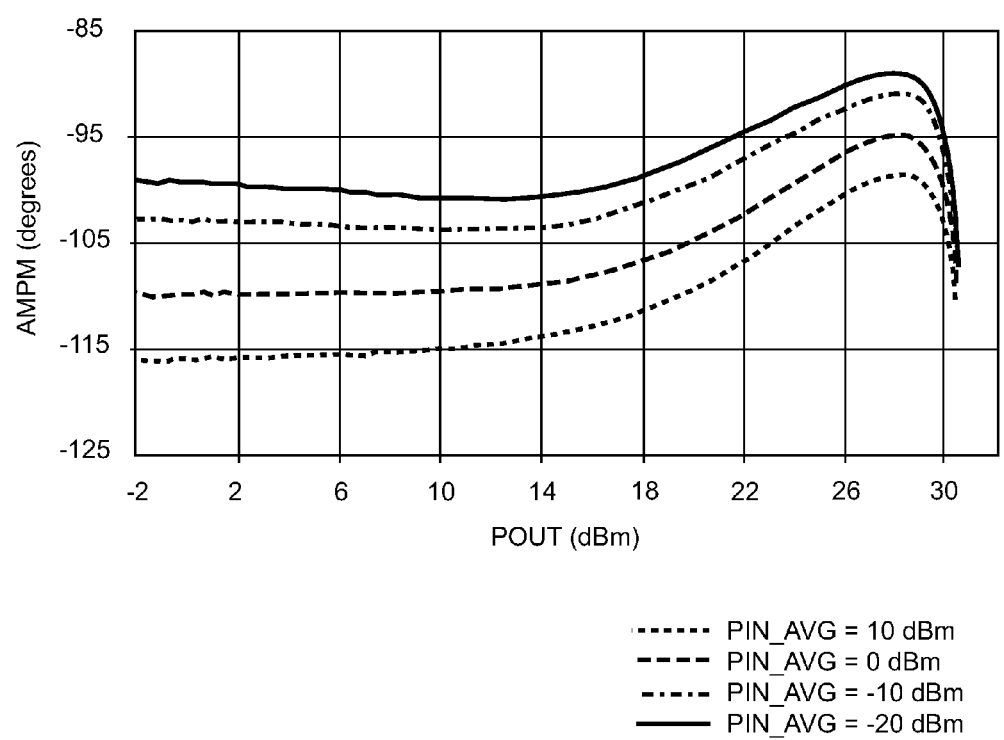
FIG. 5 is graph of exemplary amplitude modulation—phase modulation (AMPM) data corresponding to a family of steady state average power input curves.

Application of an average steady state condition for input power can significantly affect the thermally sensitive characteristics of a DUT. As an example, consider the amplitude modulation—amplitude modulation (AMAM) and amplitude modulation—phase modulation (AMPM) measurements of a typical PA. FIG. 4 is a graph of AMAM measurements, while FIG. 5 is a graph of AMPM measurements. Taken together, the family of curves in both graphs shows how the complex gain of the typical amplifier varies as the steady state average input power changes during the DUT off portions of the duty cycle.

Figure 6:
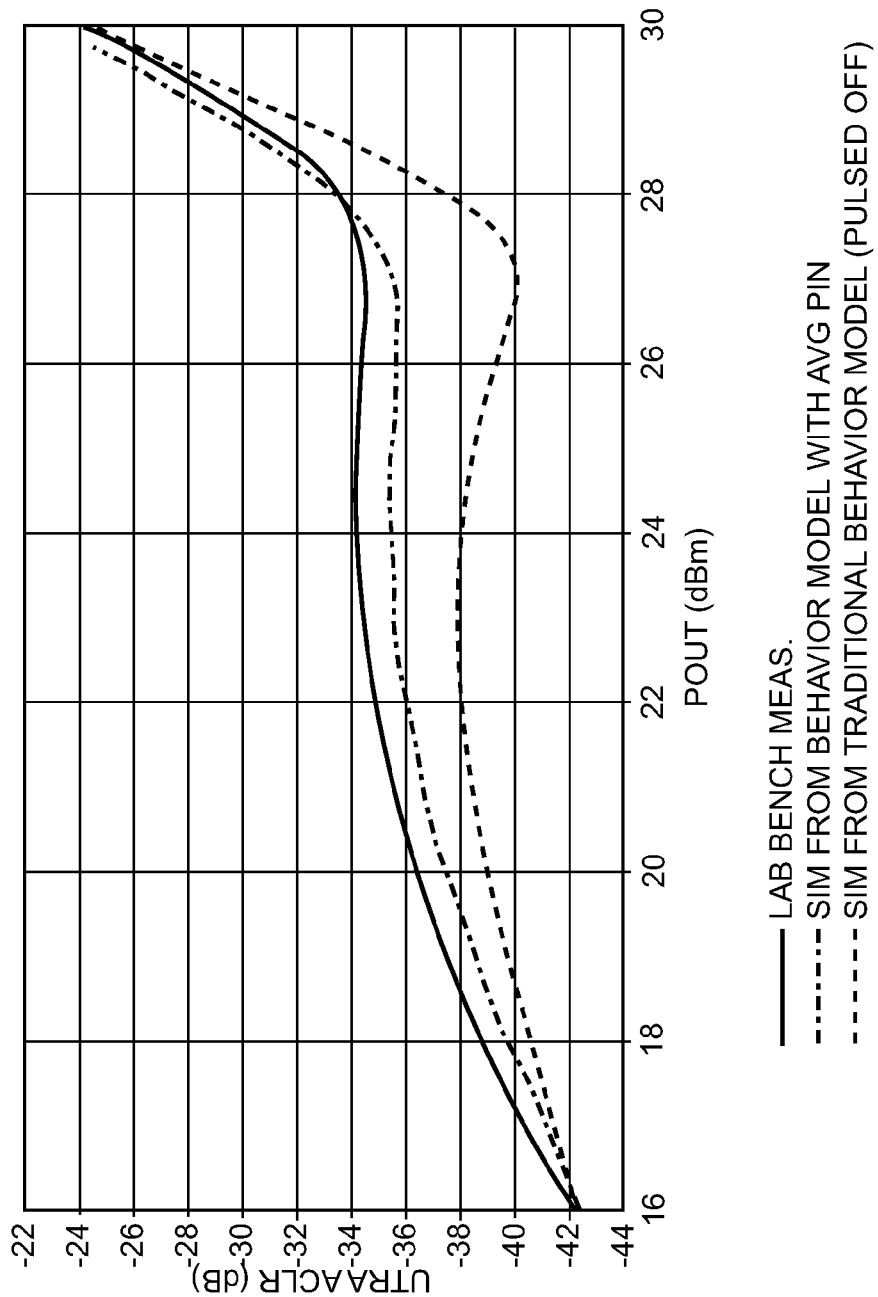
FIG. 6 is a graph of exemplary UMTS Terrestrial Radio Access (U TRA) Adjacent Channel Leakage Ratio (ACLR) results produced with a DUT behavior model obtained via the present method for pulsed behavior modeling of a DUT using steady state conditions.

FIG. 6 is a graph of exemplary results produced with a DUT behavior model obtained via the present method for pulsed behavior modeling of a DUT using steady state conditions. In particular, the graph of FIG. 6 shows the benefit of modeling the behavior of the DUT under steady state average conditions. The behavior model in this exemplary case is UMTS Terrestrial Radio Access (UTRA) Adjacent Channel Leakage Ratio (ACLR) versus output power of the DUT. The dotted and dashed curve reflects a behavior model obtained using the method of the present disclosure where an average operating condition is set at a steady state value by applying an average input power to the DUT during off portions of each duty cycle during a measurement sweep. This behavior model is a compilation of a plurality of average input power drive levels. The dotted and dashed curve was generated from a simulation using this behavior model as a function of average input power. Notice that the dotted and dashed curve shows an improved correlation with lab measurements depicted by the solid curve as compared to the dashed curve generated using a traditional behavior model obtained from sweep measurements taken with the DUT disabled during the off portions of each duty cycle.

Figure 7:
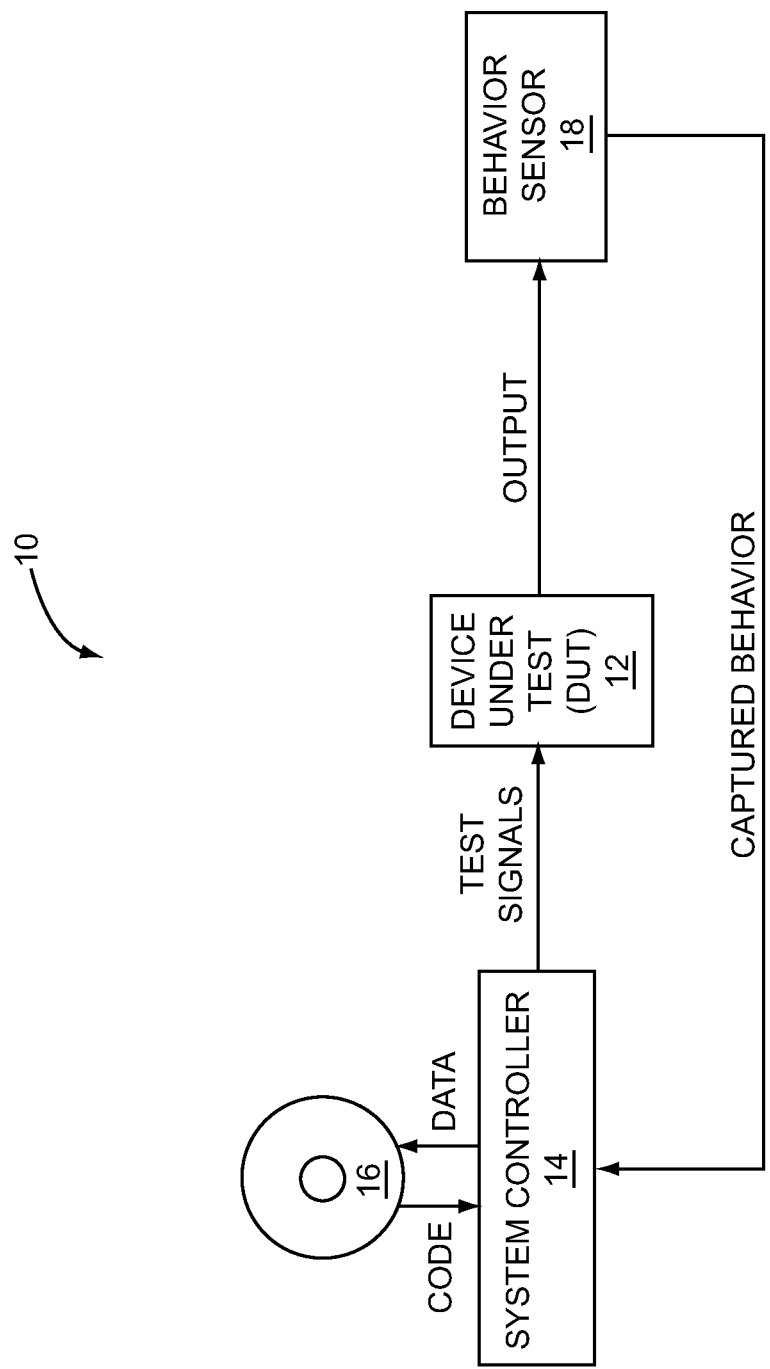
FIG. 7 is a block diagram of an automatic test system (ATS) configured to implement the present method for pulsed behavior modeling of a DUT using steady state conditions.

FIG. 7 is a block diagram of an automated test system (ATS) 10 that is usable to perform the measurements needed to capture at least one behavior of a DUT 12. The ATS 10 includes a system controller 14 that has a computing device that executes code from a tangible computer-readable medium 16. The system controller 14 provides test signals to the DUT 12. These test signals can include but are not limited to, input power levels, bias levels, and supply voltage levels. The DUT 12 provides at least one output in response to such test signals. The output of DUT 12 is detected by a behavior sensor 18 that captures at least one behavior via at least one measurement that is transmitted to the system controller 14. The behavior sensor 18 can be, but is not limited to, a power detector, a voltmeter, and a phase detector. Data for a behavior model for the DUT 12 can then be recorded to the tangible computer-readable medium 16. The system controller 14 may derive the behavior model for the DUT 12 using the data of the captured behavior or the system controller 14 can pass along the data of the captured behavior to an external processor (not shown) for behavior model generation.

Figure 8:
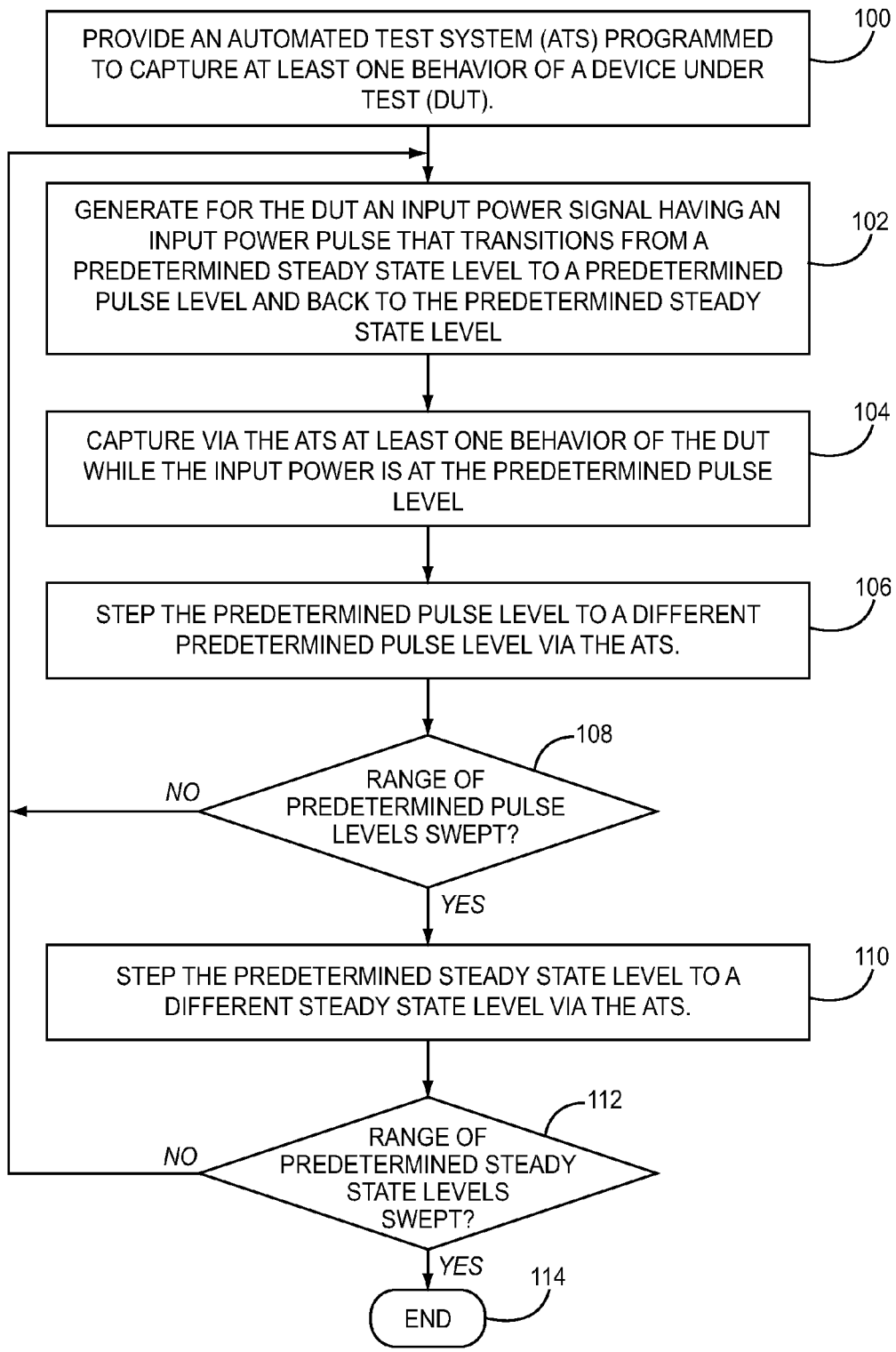
FIG. 8 is a flow chart of a general method for conducting pulsed behavior modeling with steady state average conditions.

FIG. 8 is a flow chart of a general method provided by the present disclosure for conducting pulsed behavior modeling with steady state average conditions. The method begins by providing the ATS 10 (FIG. 7), which is programmed to capture at least one behavior of a DUT (step 100). The ATS 10 generates for the DUT 12 (FIG. 7) an input power signal having an input pulse that transitions from a predetermined steady state level to a predetermined pulse level and back to the predetermined steady state level (step 102). Next, the ATS 10 captures via the behavior sensor 18 (FIG. 7) at least one behavior of the DUT 12 while the input power is at a predetermined pulse level (step 104). The ATS 10 then steps the predetermined pulse level to a different predetermined pulse level (step 106). The step in pulse level is typically an increment or decrement of a desired amount such as 1 dB. The ATS 10 then determines if a desired range of predetermined pulse levels has been swept (step 108). If not, steps 102 through 108 are repeated for the next predetermined pulse level. If yes, the ATS 10 steps the predetermined steady state level to a different steady state level (step 110). The ATS 10 then determines if a desired range of predetermined steady state levels has been swept (step 112). If not, steps 102 through 112 are repeated for the next predetermined pulse level. If yes, the ATS 10 ends the method (step 114). The captured behavior data is then usable to derive a model behavior for the DUT.

Figure 9A:
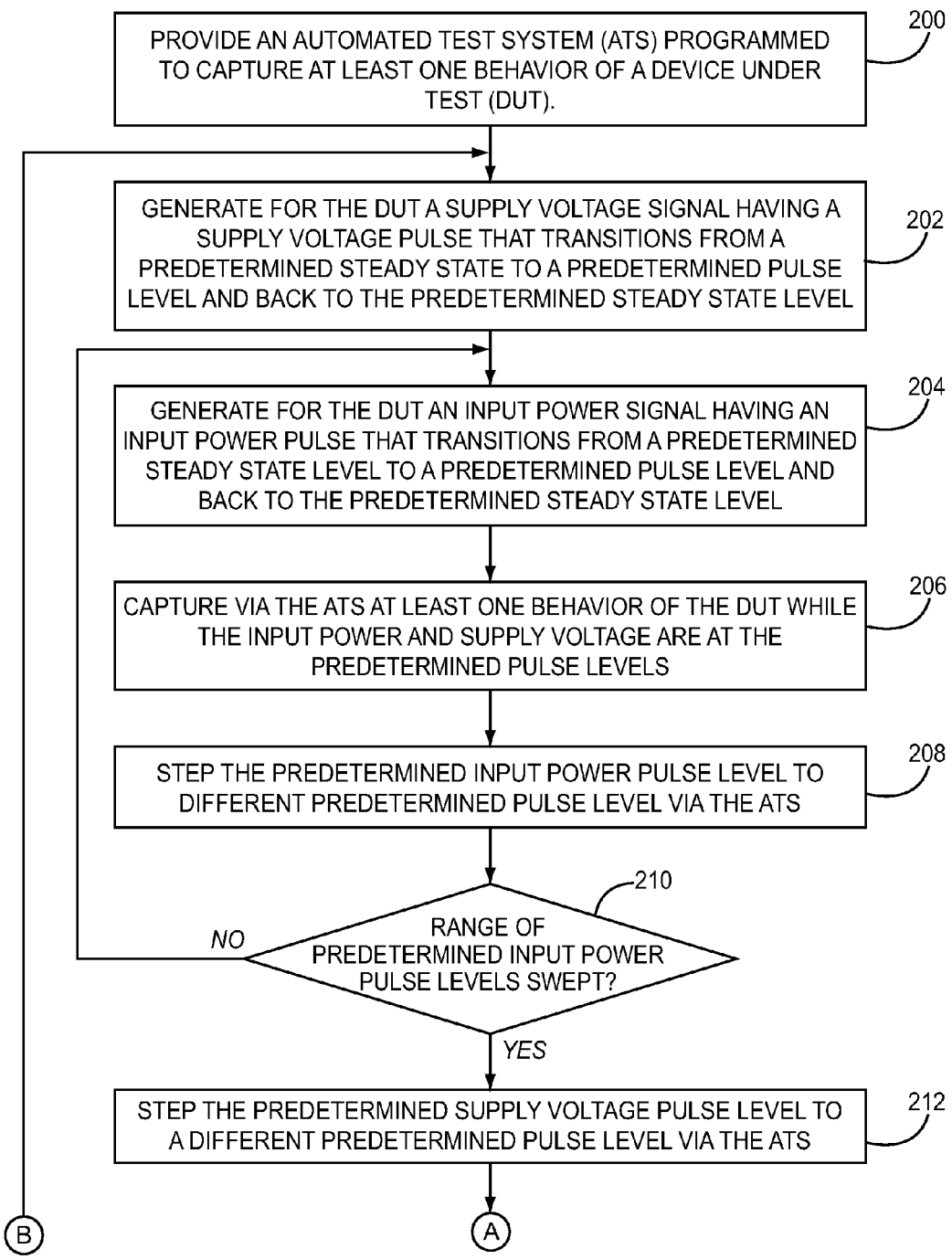
FIG. 9A is a flow chart of an enhanced method for conducting pulsed behavior modeling with steady state average conditions.
Figure 9B:
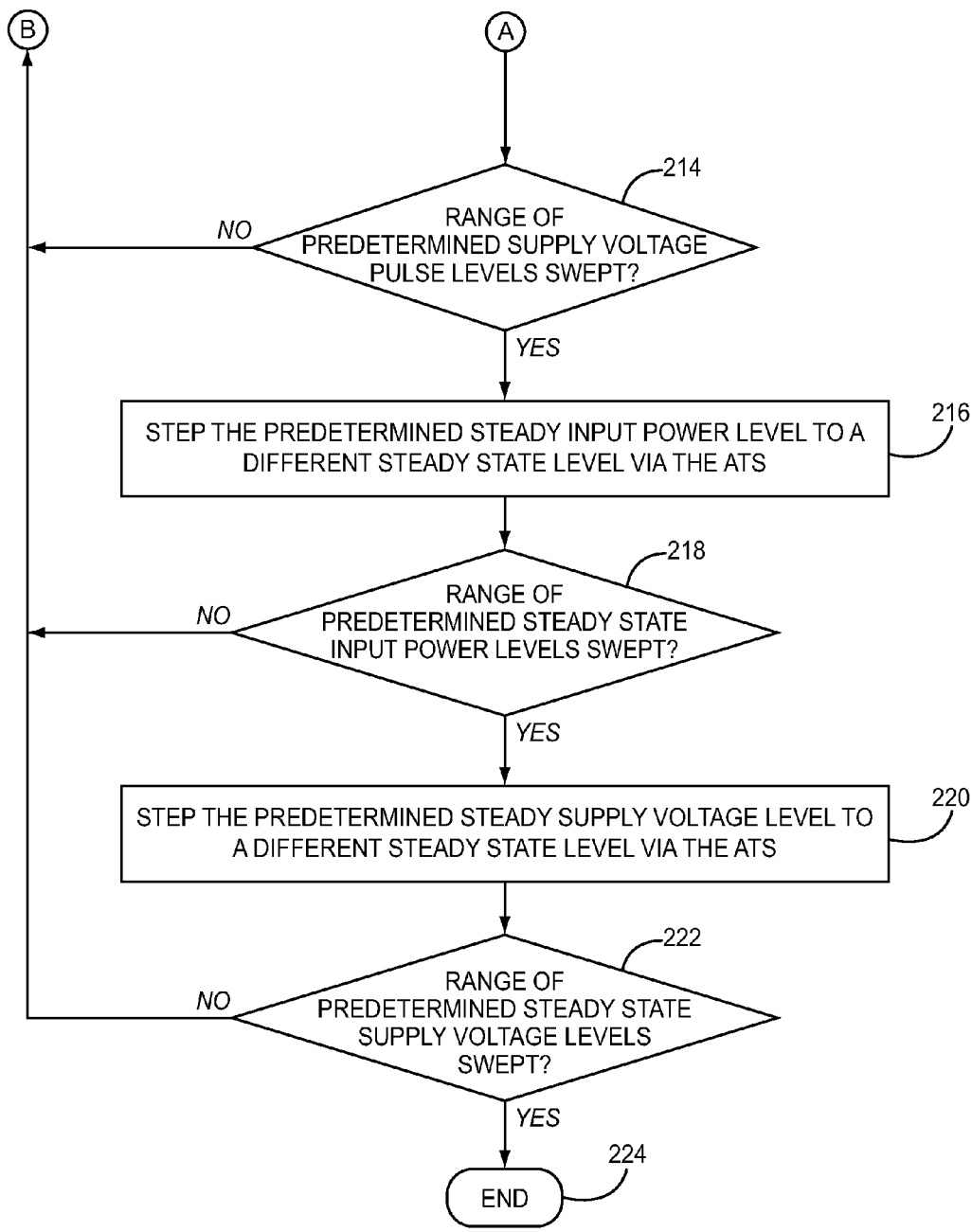
FIG. 9B is a continuation of the flow chart of FIG. 9A.

FIGS. 9A and 9B make up a flow chart of an extended method for conducting pulsed behavior modeling with steady state average conditions. In particular, the extended method adds pulse modeling of PA behavior under envelope tracking conditions. The extended method begins by providing the ATS 10 (FIG. 7), which is programmed to capture at least one behavior of a DUT (step 200). The ATS 10 generates for the DUT 12 (FIG. 7) a supply voltage signal having a supply voltage pulse that transitions from a predetermined steady state level to a predetermined pulse level and back to the predetermined steady state level (step 202). Then, the ATS 10 generates for the DUT 12 (FIG. 7) an input power signal having an input power pulse that transitions from a predetermined steady state level to a predetermined pulse level and back to the predetermined steady state level (step 204). Next, the ATS 10 captures via the behavior sensor 18 (FIG. 7) at least one behavior of the DUT 12 while the supply voltage and input power are at the predetermined pulse levels (step 206). The ATS 10 then steps the predetermined input power pulse level to a different predetermined input power pulse level (step 208). The step in pulse level is typically an increment or decrement of a desired amount such as 1 dB. The ATS 10 then determines if a desired range of predetermined input power pulse levels has been swept (step 210). If not, steps 204 through 210 are repeated for the next predetermined input power pulse level. The ATS 10 then steps the predetermined supply voltage pulse level for the DUT 12 to a different predetermined supply voltage pulse level (step 212). The step in supply voltage level is typically an increment or decrement of a desired amount such as 1 V. The ATS 10 then determines if a desired range of predetermined supply voltage pulse levels has been swept (step 214). If not, steps 202 through 214 are repeated for the next predetermined supply voltage pulse level. The initial predetermined input power pulse level is also re-established. If yes, the ATS 10 steps the predetermined steady state input power level to a different steady state input power level (step 216). The ATS 10 then determines if a desired range of predetermined steady state input power levels has been swept (step 218). If not, steps 202 through 218 are repeated for the next predetermined steady state input power level. The initial predetermined input power pulse level and initial predetermined supply voltage pulse level are also re-established. If yes, the ATS 10 steps the predetermined steady state supply voltage level to a different steady state supply voltage level (step 220). The ATS 10 then determines if a desired range of predetermined supply voltage levels has been swept (step 222). If not, steps 202 through 222 are repeated for the next predetermined steady state supply voltage level. The initial predetermined input power pulse level, initial predetermined supply voltage pulse level, and initial predetermined steady state input power level are also re-established. If yes, the ATS 10 ends the extended method (step 224). The captured behavior data is then usable to derive a model behavior for the DUT.

Those skilled in the art will recognize improvements and modifications to the embodiments of the present disclosure. All such improvements and modifications are considered within the scope of the concepts disclosed herein and the claims that follow.

What is claimed is:

1. A method for pulsed behavior modeling of a device under test (DUT) comprising:
generating for the DUT an input power signal having an input power pulse that transitions from a predetermined steady state level to a predetermined pulse level and back to the predetermined steady state level;
capturing at least one behavior of the DUT while the input power is at the predetermined pulse level;
stepping the predetermined pulse level to a different predetermined pulse level;
repeating the above steps until a range of predetermined pulse levels is swept;
stepping the predetermined steady state level to a different steady state level; and
repeating the above steps until a range of predetermined steady state levels is swept.

2. The method of claim 1 wherein the DUT is a power amplifier (PA).

3. The method of claim 2 wherein the at least one behavior is amplitude modulation-amplitude modulation (AMAM) behavior for each predetermined steady state level and each predetermined pulse level.

4. The method of claim 2 wherein the at least one behavior is amplitude modulation-phase modulation (AMPM) behavior for each predetermined steady state level and each predetermined pulse level.

5. The method of claim 1 wherein the range of predetermined pulse levels is from around −30 dBm to around 10 dBm.

6. The method of claim 5 wherein an iterative step of predetermined pulse level is around 1 dB while stepping the predetermined pulse level to a different predetermined pulse level.

7. The method of claim 1 wherein the range of predetermined steady state levels is from around −20 dBm to around 10 dBm.

8. The method of claim 7 wherein an iterative step of predetermined steady level is around 10 dB.

9. The method of claim 2 wherein the range of predetermined steady state levels is only one steady state level of input power for an envelope tracking system.

10. The method of claim 9 further including a step of setting a predetermined average PA supply voltage in association with generating the input power signal for the DUT.

11. The method of claim 10 further including stepping a predetermined PA supply voltage pulse level to a different predetermined PA supply pulse level is associated with stepping the predetermined steady state level to a different steady state level.

12. A tangible computer-readable medium having instructions stored thereon, wherein the instructions are readable by a computing device of an automated test system to perform operations for pulsed behavior modeling of a device under test (DUT), the operations comprising:
generating for the DUT an input power signal having an input power pulse that transitions from a predetermined steady state level to a predetermined pulse level and back to the predetermined steady state level;
capturing at least one behavior of the DUT while the input power is at the predetermined pulse level;
stepping the predetermined pulse level to a different predetermined pulse level;
repeating the above steps until a range of predetermined pulse levels is swept;
stepping the predetermined steady state level to a different steady state level; and
repeating the above steps until a range of predetermined steady state levels is swept.

13. The tangible computer-readable medium of claim 12 wherein the DUT is a power amplifier (PA).

14. The tangible computer-readable medium of claim 13 wherein the at least one behavior is amplitude modulation-amplitude modulation (AMAM) behavior for each predetermined steady state level and each predetermined pulse level.

15. The tangible computer-readable medium of claim 13 wherein the at least one behavior is amplitude modulation-phase modulation (AMPM) behavior for each predetermined steady state level and each predetermined pulse level.

16. The tangible computer-readable medium of claim 12 wherein the range of predetermined pulse levels is from around −30 dBm to around 10 dBm.

17. The tangible computer-readable medium of claim 16 wherein an iterative step of predetermined pulse level is around 1 dB while stepping the predetermined pulse level to a different predetermined pulse level.

18. The tangible computer-readable medium of claim 12 wherein the range of predetermined steady state levels is from around −20 dBm to around 10 dBm.

19. The tangible computer-readable medium of claim 18 wherein an iterative step of predetermined steady level is around 10 dB.

20. The tangible computer-readable medium of claim 13 wherein the range of predetermined steady state levels is only one steady state level of input power for an envelope tracking system.

21. The tangible computer-readable medium of claim 20 further including a step of setting a predetermined average PA supply voltage in association with generating the input power signal for the DUT.

22. The tangible computer-readable medium of claim 21 further including stepping a predetermined PA supply voltage pulse level to a different predetermined PA supply pulse level is associated with stepping the predetermined steady state level to a different steady state level.

* * * * *